United States Patent
Kim et al.

(10) Patent No.: US 12,068,185 B2
(45) Date of Patent: Aug. 20, 2024

(54) INTERLAYER TRANSFER APPARATUS AND ARTICLE TRANSFER SYSTEM INCLUDING THE SAME

(71) Applicant: SAMSUNG ELECTRONICS CO., LTD., Suwon-si (KR)

(72) Inventors: Young Wook Kim, Seoul (KR); Sang Min Kim, Hwaseong-si (KR); Chul-Jun Park, Seoul (KR); Jae Sung Byun, Suwon-si (KR); Yong-Jun Ahn, Suwon-si (KR); Sang Kyung Lee, Hwaseong-si (KR); Hyun Woo Lee, Hwaseong-si (KR); Jeong Hun Lim, Suwon-si (KR); Jun Hyuk Chang, Hwaseong-si (KR); Kyu Bum Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 224 days.

(21) Appl. No.: 17/854,681

(22) Filed: Jun. 30, 2022

(65) Prior Publication Data
US 2023/0099726 A1    Mar. 30, 2023

(30) Foreign Application Priority Data
Sep. 23, 2021    (KR) .................. 10-2021-0125624

(51) Int. Cl.
*H01L 21/677* (2006.01)
*B65G 1/06* (2006.01)

(52) U.S. Cl.
CPC .......... *H01L 21/67712* (2013.01); *B65G 1/06* (2013.01); *H01L 21/67736* (2013.01); *B65G 2201/0297* (2013.01)

(58) Field of Classification Search
CPC ......... H01L 21/67712; H01L 21/67736; H01L 21/67766; H01L 21/67778;
(Continued)

(56) References Cited

U.S. PATENT DOCUMENTS 9,230,834 B2    1/2016    Fukutomi et al.
9,666,463 B2    5/2017    Morikawa et al.
(Continued)

FOREIGN PATENT DOCUMENTS

DE    102008012409 B4 *    8/2017    ............... B61B 3/02
JP    2020-136397 A    8/2020
(Continued)

OTHER PUBLICATIONS

Inui Yoshitaka, Control Method for Controlling an Article Processing System, Aug. 17, 2017, Clarivate Analytics, pp. 1-51. (Year: 2017).*

*Primary Examiner* — Antony M Paul
(74) *Attorney, Agent, or Firm* — Sughrue Mion, PLLC

(57) ABSTRACT

An article transfer system includes a plurality of stage modules respectively provided at a plurality of layers, an interlayer transfer apparatus configured to transfer an article to each of the plurality of stage modules, and a plurality of loading and unloading apparatus respectively provided on each stage module of the plurality of stage modules, the plurality of loading and unloading apparatus configured to load an article onto respective stage modules of the plurality of stage modules. The interlayer transfer apparatus includes a mast frame extending so as to intersect each stage module of the plurality of stage modules, and a plurality of carriage units configured to move along a length direction of the mast frame, transfer articles, and move in a parallel manner with each other.

20 Claims, 14 Drawing Sheets

(58) Field of Classification Search
CPC ........... H01L 21/67781; H01L 21/6773; H01L 21/67775; H01L 21/68; H01L 21/67706; B65G 1/06; B65G 2201/0297; B65G 49/07; B65G 1/127; B65G 1/133; B65G 1/065; B65G 1/08; B65G 1/0457; B65G 1/0492; B65G 1/12; B65G 49/061; H02P 6/006; H02P 25/06; H02P 3/00; H02P 6/00; H02P 6/24
See application file for complete search history.

(56) References Cited

U.S. PATENT DOCUMENTS

| | | |
|---|---|---|
| 10,486,903 B2 | 11/2019 | Yoshioka et al. |
| 2020/0098602 A1 | 3/2020 | Inagaki et al. |
| 2021/0159293 A1 | 5/2021 | Kuwahara et al. |

FOREIGN PATENT DOCUMENTS

| | | |
|---|---|---|
| KR | 10-2013-0110056 A | 10/2013 |
| KR | 10-2020-0003104 A | 1/2020 |

\* cited by examiner

INTERLAYER TRANSFER APPARATUS AND ARTICLE TRANSFER SYSTEM INCLUDING THE SAME

CROSS-REFERENCE TO RELATED APPLICATION

This application claims priority from Korean Patent Application No. 10-2021-0125624 filed on Sep. 23, 2021 in the Korean Intellectual Property Office, and all the benefits accruing therefrom under 35 U.S.C. 119, the contents of which in its entirety are herein incorporated by reference.

BACKGROUND

Field of the Invention

The disclosure relates to an interlayer transfer apparatus and an article transfer system including the same. More specifically, the disclosure relates to an interlayer transfer apparatus which may be installed in a semiconductor manufacturing facility and an article transfer system including the same.

Description of Related Art

An interlayer transfer apparatus may transfer an article such as front opening unified/universal pod (FOUP) in an interlayer transfer manner in a semiconductor manufacturing facility. This interlayer transfer apparatus may transfer the article in the interlayer transfer manner using a belt pulley structure.

When the interlayer transfer apparatus uses the belt pulley structure, the apparatus may not transfer a plurality of articles at the same time. Further, in an environment in which the number of articles to be transferred is increasing due to a recent trend of a larger height and multi-layers of a semiconductor manufacturing factory (FAB), the apparatus cannot handle the larger transfer volume such that the articles may be accumulated thereon. This may lower transfer efficiency.

SUMMARY

Provided are an interlayer transfer apparatus that may transfer a plurality of articles at the same time, and have units which may operate independently and move in a parallel manner, and an article transfer system including the same.

Additional aspects will be set forth in part in the description which follows and, in part, will be apparent from the description, or may be learned by practice of the presented embodiments.

In accordance with an aspect of the disclosure, an article transfer system may include a plurality of stage modules respectively provided at a plurality of layers, an interlayer transfer apparatus configured to transfer an article to each of the plurality of stage modules, and a plurality of loading and unloading apparatus respectively provided on each stage module of the plurality of stage modules, the plurality of loading and unloading apparatus configured to load an article onto respective stage modules of the plurality of stage modules. The interlayer transfer apparatus may include a mast frame extending so as to intersect each stage module of the plurality of stage modules, and a plurality of carriage units configured to move along a length direction of the mast frame, transfer articles, and move in a parallel manner with each other.

In accordance with an aspect of the disclosure, an article transfer system may include a plurality of stage modules respectively provided at a plurality of layers, an interlayer transfer apparatus configured to transfer an article to each of the plurality of stage modules, and a plurality of loading and unloading apparatus respectively provided on each stage module of the plurality of stage modules, the plurality of loading and unloading apparatus configured to load an article onto respective stage modules of the plurality of stage modules. The interlayer transfer apparatus may include a mast frame extending so as to intersect each stage module of the plurality of stage modules, a plurality of carriage units configured to move along a length direction of the mast frame and to transfer the article, a balance controller provided on the mast frame, and a rail provided on the mast frame and configured to guide movement of the plurality of carriage units. The plurality of carriage units may be configured to move in a parallel manner with each other and operate independently. Each carriage unit of the plurality of carriage units may include a built-in driver. The balance controller may be provided on a first side face of the mast frame, and the rail may be provided on a second side face of the mast frame different from the first side face. The balance controller may include a plurality of balance controllers, and the plurality of balance controllers may be configured to be respectively connected to the plurality of carriage units.

In accordance with an aspect of the disclosure, an interlayer transfer apparatus for transferring articles to each of a plurality of stage modules respectively provided at a plurality of layers may include a mast frame extending so as to intersect each stage module of the plurality of stage modules, and a plurality of carriage units configured to move along a length direction of the mast frame, transfer articles, move in a parallel manner with each other, and operation independently.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTIONS

Figure 1:
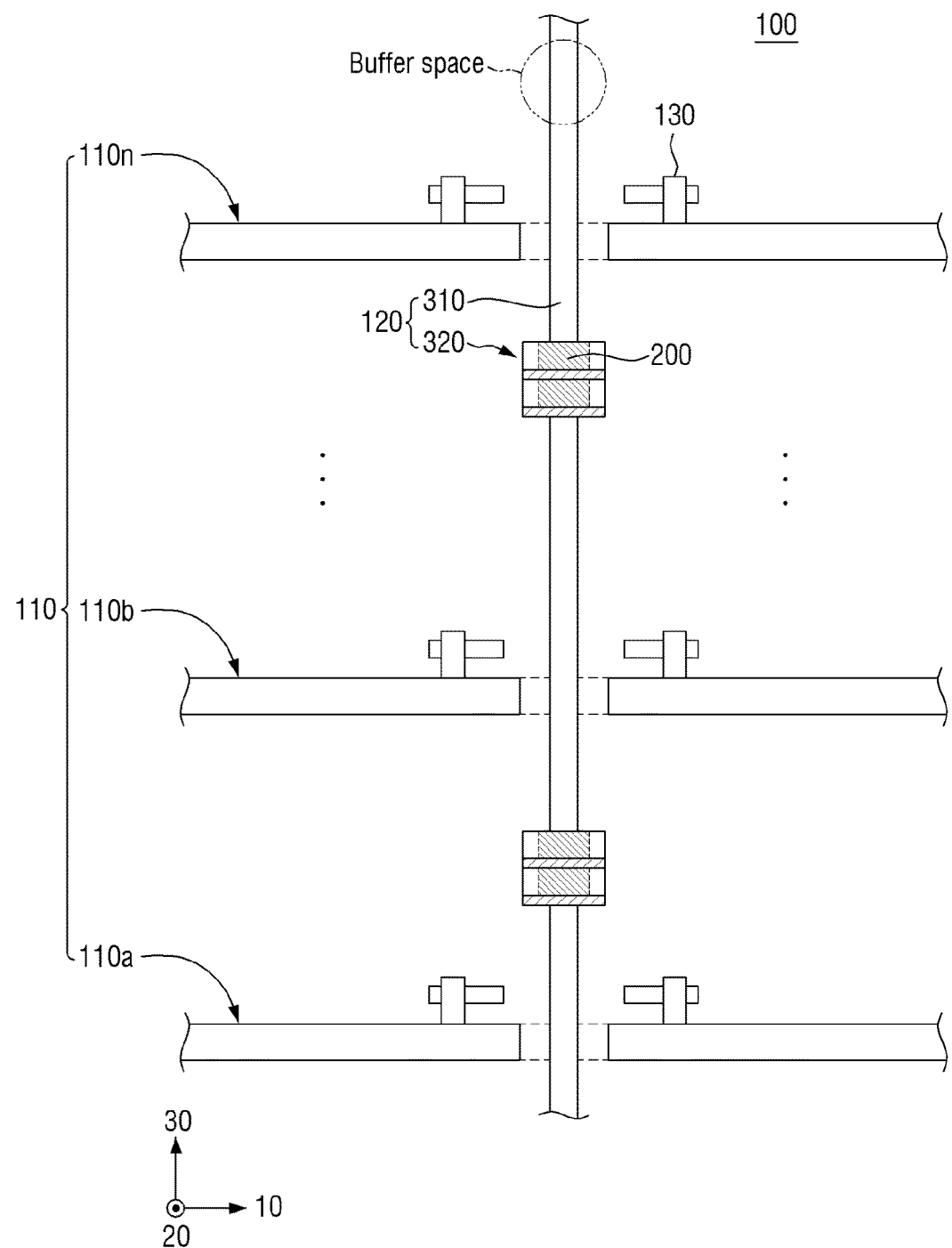
FIG. 1 is a diagram schematically showing a structure of an article transfer system including an interlayer transfer apparatus according to an embodiment.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the concept and scope of the present disclosure as defined by the appended claims.

A shape, a size, a ratio, an angle, a number, etc. disclosed in the drawings for illustrating an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the concept and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

Recently, a scale of a semiconductor manufacturing factory (FAB) is gradually increasing due to increase in demand for semiconductor supply. Further, in order to improve an integration density of a semiconductor manufacturing facility to increase production efficiency, the semiconductor manufacturing factory is becoming higher-layered and multi-layered.

As the scale of the semiconductor manufacturing factory increases and the factory becomes higher-layered and multi-layered, a quantity of articles to be transferred within the semiconductor manufacturing factory may increase. Accordingly, a need for high-speed interlayer article transfer is emerging. Further, in order to be able to respond to the demand for the article transfer within the semiconductor manufacturing factory which varies for various reasons, an interlayer transfer apparatus with flexibility is required.

The interlayer transfer apparatus generally has a belt pulley structure. The interlayer transfer apparatus having this structure has difficulty in transferring multiple articles at the same time. Thus, transfer efficiency may be lowered as the apparatus cannot transfer an entirety of a transfer required amount. Further, this may lead to a major bottleneck within a semiconductor article system due to backlog of the transfer volume. Further, after the interlayer transfer apparatus is installed in the semiconductor manufacturing facility, it is difficult to adjust an interlayer article transfer amount. Thus, there is a limitation in that it is difficult for the apparatus to respond flexibly to change in a manufacturing environment in the semiconductor manufacturing factory.

The interlayer transfer apparatus according to the present disclosure may transfer a plurality of articles at the same time. The apparatus may have units that respectively transfer articles and respectively have built-in drivers and thus may operate independently, such that the units may move in a parallel manner.

An article transfer system equipped with the interlayer transfer apparatus capable of independent movement on the same path may transfer a relatively larger amount in the interlayer transfer manner at the same time. Further, the system may perform parallel transfer of multiple articles in the semiconductor manufacturing factory with a multi-layer structure, thereby overcoming the bottleneck in the semiconductor article system. Further, the present system may have high flexibility compared to a conventional system in that the present system may flexibly adjust an interlayer transfer amount in response change in an interlayer transfer volume. As a result, the system according to the present disclosure may overcome the technical/structural limitations of the conventional system to improve the efficiency of the article transfer in an entire area of the semiconductor manufacturing factory.

Hereinafter, the present disclosure will be described in detail with reference to drawings and the like. FIG. 1 is a diagram schematically showing a structure of an article transfer system including an interlayer transfer apparatus according to an embodiment.

According to FIG. 1, an article transfer system 100 may be configured to include a stage module 110, an interlayer transfer apparatus 120 and a loading and unloading apparatus 130.

The article transfer system 100 refers to a facility that transfers an article 200 within the semiconductor manufacturing factory where a semiconductor manufacturing facility is established. This article transfer system 100 may include the interlayer transfer apparatus 120 for interlayer transfer of the article 200. For example, the system 100 may be embodied as a system equipped with a tower lift.

The article 200 transferred in the article transfer system 100 may be an article itself or a container in which the article is stored. The article may be, for example, a wafer, a glass substrate, a reticle, and the like. The container in which the article is stored may be, for example, a front opening unified/universal pod (FOUP), a pod, a magazine for accommodating therein a plurality of printed circuit boards, a tray for accommodating therein a plurality of semiconductor packages, and the like.

The article transfer system 100 may be configured to have a multi-layer structure. The article transfer system 100 may include, for example, n layers including a first layer, a second layer, . . . , and an n-th layer as shown in FIG. 1. In this connection, n is a natural number greater than or equal to 2. The multi-layer structure of the article transfer system 100 may be variously modified to include an appropriate number of layers based on the manufacturing environment in the semiconductor manufacturing factory.

When the article transfer system 100 is configured to have the multi-layer structure, each stage module 110 may be disposed in each layer of the article transfer system 100. When the article transfer system 100 is configured to include, for example, the n layers from the first layer to the n-th layer, the stage module 110 may include a first stage 110a installed in the first layer, a second stage 110b installed in a second layer, ..., and an n-th stage 110n installed in the n-th layer, etc.

The first stage 110a, the second stage 110b, ..., and the n-th stage 110n may be arranged in a vertical direction (third direction) 30 in the semiconductor manufacturing factory. For example, the second stage 110b may be installed in a layer higher than that of the first stage 110a. The third stage may be installed in a layer higher than that of the second stage 110b, and the n-th stage 110n may be installed in a layer higher than that of an (n−1)-th stage. In one example, each of the stages 110a, 110b, ..., and 110n may extend in a left and right direction (first direction) 10 in the semiconductor manufacturing factory.

The stage module 110 may guide the article 200 to a destination when the article 200 is seated thereon. For this purpose, a rail extending along the length direction (the first direction) 10 may be installed on a top face of the stage module 110, and a moving unit moving along the rail may also be constructed thereon. Further, the loading and unloading apparatus 130 is installed at one end of the stage module 110. A storage unit may be installed at the other end of the stage module 110. A detailed description of the loading and unloading apparatus 130 will be described later. In one example, the storage unit may temporarily store therein the article 200.

The interlayer transfer apparatus 120 may be mechanically configured for interlayer transfer of the article 200. This interlayer transfer apparatus 120 may be configured to serve as a tower lift in the semiconductor manufacturing factory.

The interlayer transfer apparatus 120 may move in a height direction (the third direction) 30 within the semiconductor manufacturing factory. For this purpose, the interlayer transfer apparatus 120 may include a mast frame 310 extending in the vertical direction 30, and a carriage unit 320 moving along the vertical direction.

The interlayer transfer apparatus 120 may transfer the article 200 loaded on the carriage unit 320 in the interlayer transfer manner. However, an embodiment is not limited thereto. The interlayer transfer apparatus 120 may transfer the article 200 using a gripping unit, a fork unit, or the like instead of the carriage unit 320. In another example, the interlayer transfer apparatus 120 in this embodiment may transfer the article 200 in various schemes.

Figure 2:
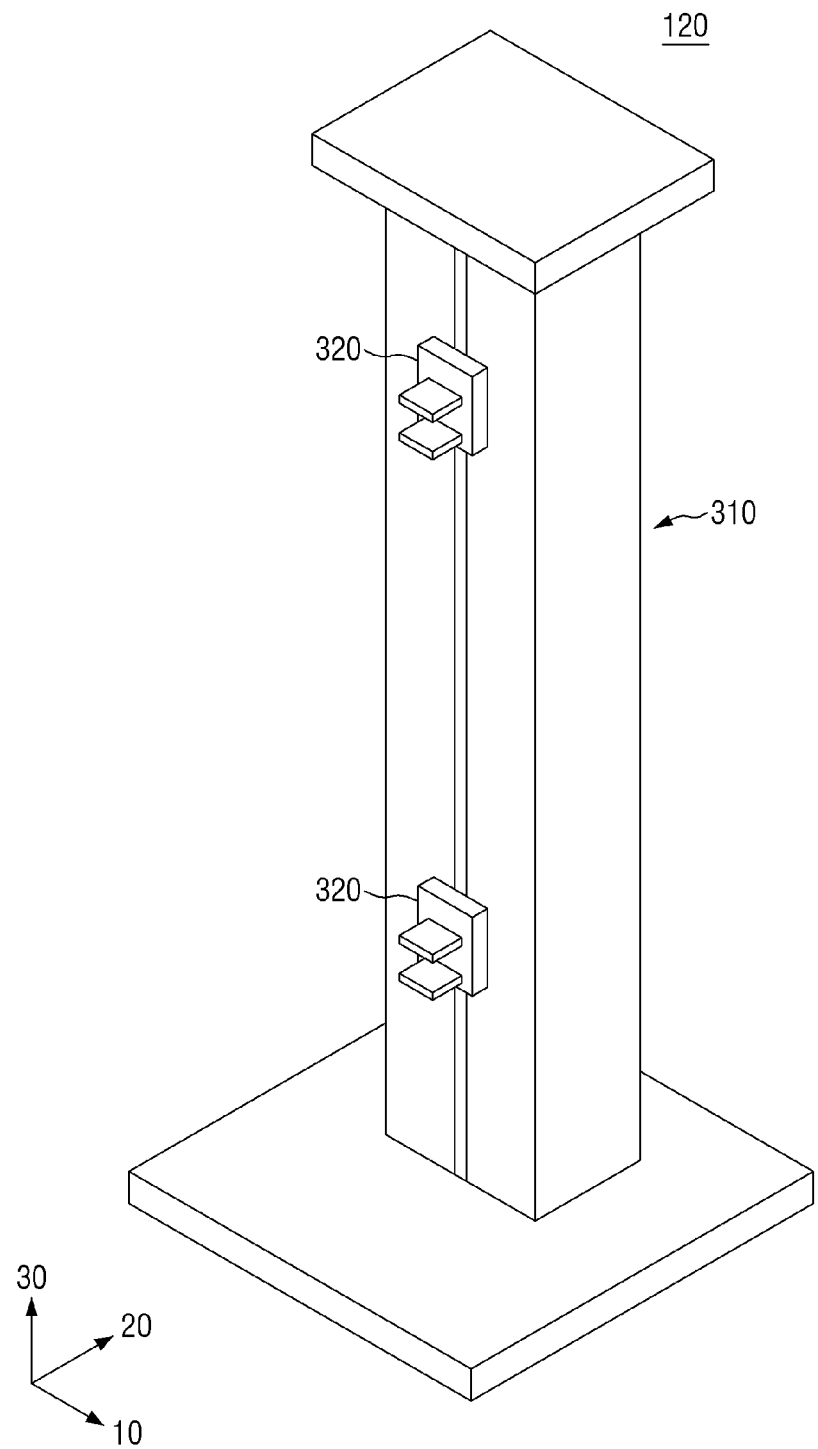
FIG. 2 is a diagram illustrating the mast frame and the carriage unit of the interlayer transfer apparatus according to an embodiment.
Figure 3:
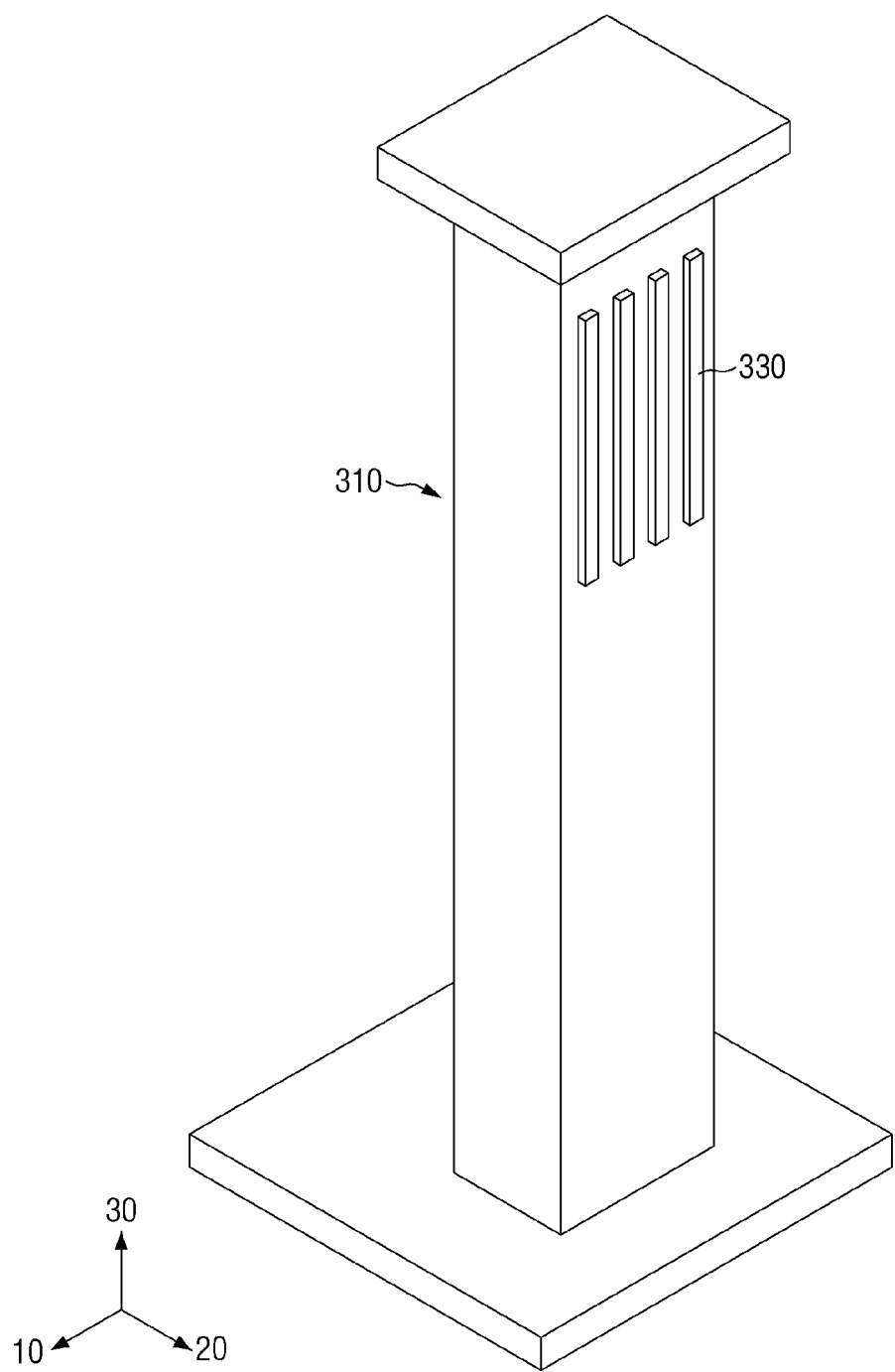
FIG. 3 is a diagram illustrating the mast frame and the carriage unit of the interlayer transfer apparatus according to an embodiment.

FIG. 2 is a diagram illustrating the mast frame and the carriage unit of the interlayer transfer apparatus according to an embodiment. FIG. 3 is a diagram illustrating the mast frame and the carriage unit of the interlayer transfer apparatus according to an embodiment. Following descriptions refer to FIG. 1 to FIG. 3.

The mast frame 310 supports the carriage unit 320, and serves to guide a linear motion of the carriage unit 320. The mast frame 310 may have a profile structure and may extend to intersect each stage module 110 disposed in each layer in the article transfer system 100. The mast frame 310 may guide the movement of the carriage unit 320 so that the carriage unit 320 may transfer the article 200 to each layer of the article transfer system 100.

The carriage unit 320 may move in the vertical direction (the third direction) 30 and along one side face of the mast frame 310. In this connection, a plurality of balance controllers 330 may be disposed on the other side face of the mast frame 310. Although not shown in FIG. 1 to FIG. 3, the plurality of balance controllers 330 may be connected to a plurality of carriage units 320 using a belt pulley structure. The balance controller 330 may be embodied as, for example, a counter weight.

The balance controller 330 may be installed on the other side face of the mast frame 310. In this case, the plurality of balance controllers 330 may be arranged in a plurality of rows and may extend along the vertical direction (the third direction) 30. However, an embodiment is not limited thereto. The balance controller 330 may be installed on an entire area of the other side face of the mast frame 310.

In one example, a component that serves to reduce a load of the driver received in the carriage unit 320 may be installed on the mast frame 310.

The plurality of carriage units 320 may be disposed on the mast frame 310. In an example of FIG. 1 and FIG. 2, two carriage units 320 are arranged on the mast frame 310. However, the number of carriage units 320 arranged on the mast frame 310 may vary depending on a transfer amount of the articles in the semiconductor manufacturing factory.

The carriage unit 320 may transfer a plurality of articles 200. For this purpose, the carriage unit 320 may include multiple shelves for loading the articles 200 thereon. In the example in FIG. 1 and FIG. 2, the carriage unit 320 is shown to include two shelves. However, the number of shelves in the carriage unit 320 may vary according to a required interlayer transfer amount in the semiconductor manufacturing factory. The amount may vary according to situations.

The carriage units 320 may operate independently on the mast frame 310 and may move in parallel with each other. The carriage unit 320 may move using, for example, a linear motor, or may move using a pinion gear.

Further, the carriage units 320 may perform interactive actions therebetween such as power transfer and communication in a non-contact state, and may move along the mast frame 310 at a low vibration and low noise state. The carriage unit 320 may optimize a transfer environment of the article 200 using the above structure, and may contribute to production of a high-quality product.

Figure 4:
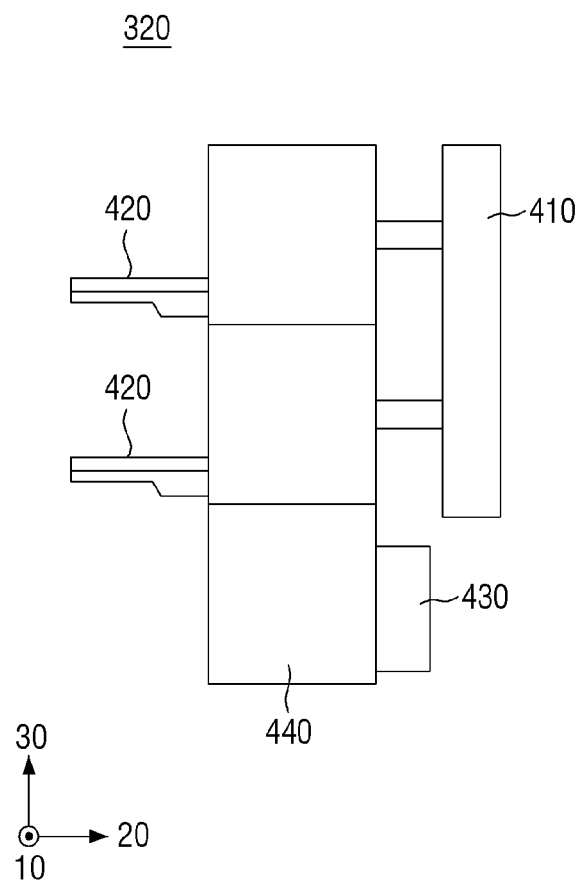
FIG. 4 is a diagram schematically showing an internal structure of the carriage unit of the interlayer transfer apparatus according to an embodiment.

FIG. 4 is a diagram schematically showing an internal structure of the carriage unit of the interlayer transfer apparatus according to an embodiment. The carriage unit 320 may be configured to include a driver 410, an article receiving portion 420, an electrical power receiver 430 and a controller 440 as shown in FIG. 4.

The driver 410 serves to provide power to the carriage unit 320 to move along the mast frame 310. The driver 410 may be modified into various forms depending on a manufacturing environment in the semiconductor manufacturing factory. However, in this embodiment, the driver is limited to have a structure that enables independent movement of the carriage unit 320. The driver 410 may be embodied as a linear motor (LM) guide system including a linear motor when the carriage unit 320 operates using the linear motor. When the carriage unit 320 operates using a pinion gear, the driver 410 may be embodied as a system that includes the pinion gear.

Figure 5:
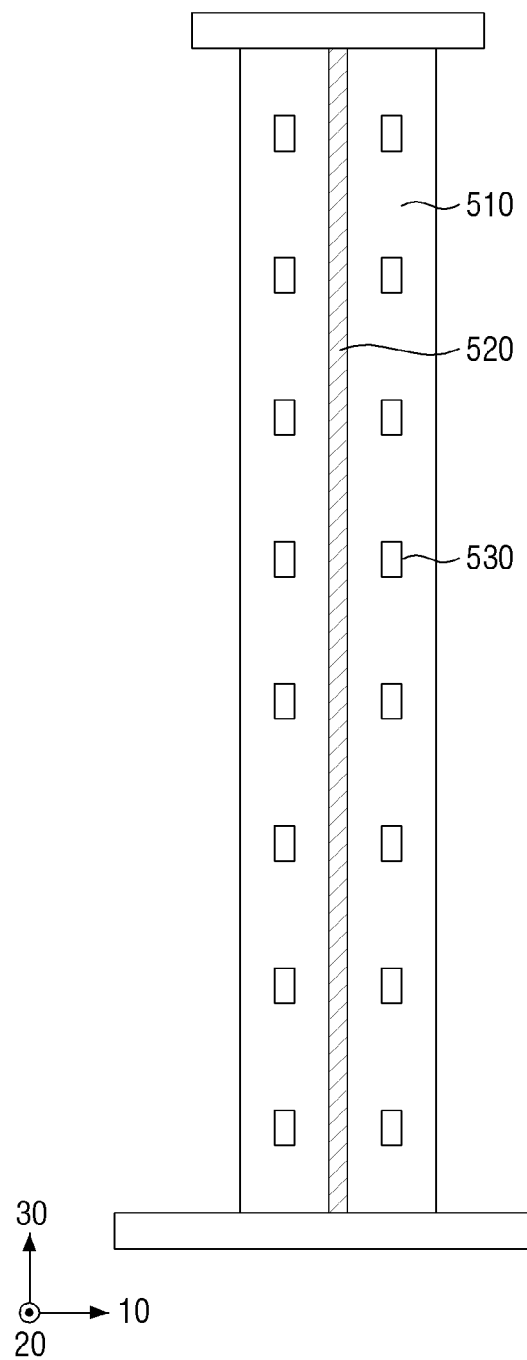
FIG. 5 is a diagram illustrating an internal configuration of the mast frame of the interlayer transfer apparatus according to an embodiment.

FIG. 5 is a diagram illustrating an internal configuration of the mast frame of the interlayer transfer apparatus according to an embodiment. For the carriage unit 320 to move along the mast frame 310, a rail system that may be engaged with the driver 410 of the carriage unit 320 may be installed on the mast frame 310. The rail system 520 may extend along the third direction 30 of a body 510 of an outer shape of the mast frame 310 as shown in FIG. 5.

The rail system 520 may be configured to have a shape varying according to a type of the driver 410 of the carriage unit 320. For example, when the driver 410 of the carriage unit 320 is embodied as the LM guide system, the rail system 520 may be embodied as a guide rail engaged with the LM guide system. Further, when the driver 410 of the carriage unit 320 is embodied as the system including a pinion gear, the rail system 520 may be embodied as a system including a rack that is engaged with the pinion gear. That is, a combination of the driver 410 of the carriage unit 320 and the rail system 520 of the mast frame 310 may be embodied as a rack and pinion gear system.

Referring to FIG. 4, the article receiving portion 420 defines a seating face for loading the article 200 thereon. Each of a plurality of article receiving portions 420 may be installed in a shelf shape on a front face of the controller 440. However, in this embodiment, a single article receiving portion may suffice. When a plurality of article receiving portions 420 are disposed in the carriage unit 320, a plurality of articles 200 may be transferred at a time, and thus a time required to transfer the plurality of article 200 may be reduced.

When the plurality of article receiving portions 420 are installed on the front face of the controller 440, the plurality of article receiving portions 420 may be sequentially arranged along the vertical direction (third direction) 30 of the controller 440. However, an embodiment is not limited thereto. The plurality of article receiving portions 420 may be sequentially arranged along the first direction 10 as a width direction of the controller 440, or may be arranged in a zigzag form along the height direction and the width direction of the controller 440.

The electrical power receiver 430 serves to provide a power source to the driver 410 so that the carriage unit 320 may move along the mast frame 310. This electrical power receiver 430 may communicate with an electrical power supply 530 installed in the mast frame 310 and receive the power source from the electrical power supply 530 and then provide the power source to the driver 410.

Figure 6:
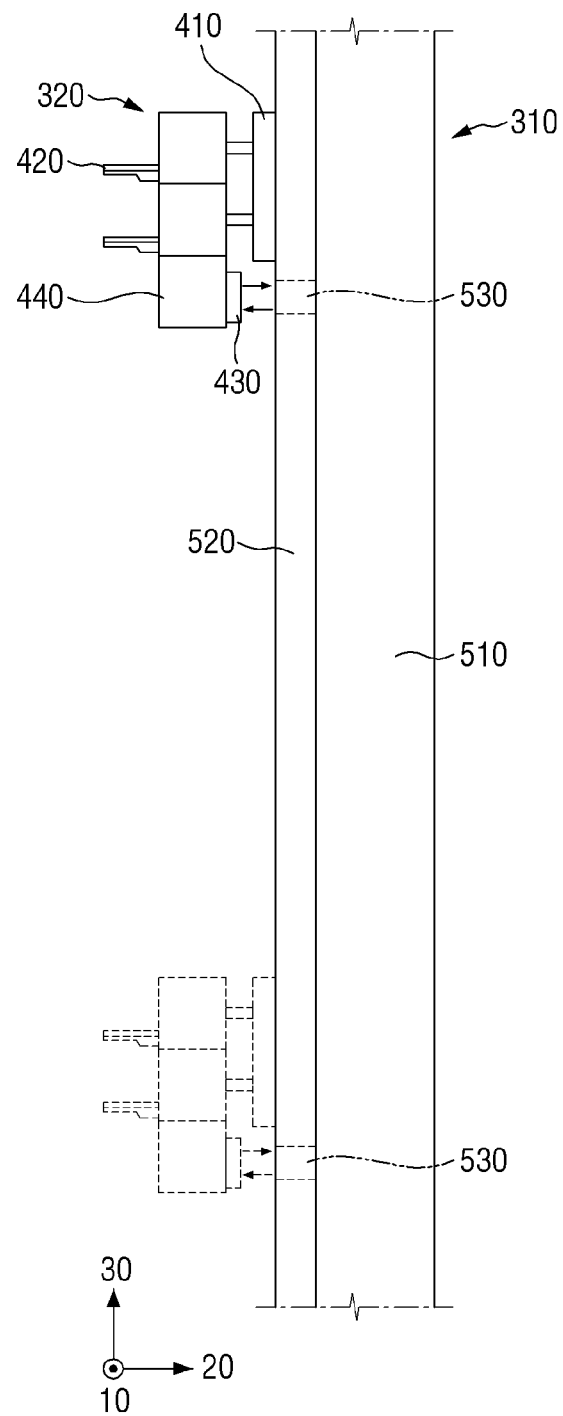
FIG. 6 is a diagram illustrating an operating principle of the carriage unit of the interlayer transfer apparatus according to an embodiment.

FIG. 6 is a diagram illustrating an operating principle of the carriage unit of the interlayer transfer apparatus according to an embodiment. The electrical power receiver 430 may receive the power source while wirelessly communicating with the electrical power supply 530 as shown in FIG. 6. The electrical power receiver 430 may not contact the electrical power supply 530 accordingly. The electrical power receiver 430 may receive the power source from the electrical power supply 530 using, for example, a wireless local area network (LAN) scheme.

The electrical power supply 530 may supply the power source to the electrical power receiver 430 in a non-contact state as described above. The electrical power supply 530 may be embodied as, for example, a non-contact power device (human interface device (HID)) or a non-contact point power device.

The power supplies 530 may be arranged in parallel with the rail system 520 and along the length direction of the body 510 as shown in FIG. 5. A plurality of electrical power supply units 530 may be installed on the body 510 and may be spaced from each other at a regular spacing so that the carriage unit 320 may continuously receive the power source while moving along the rail system 520. The electrical power supply 530 may be installed on both opposing side faces of the rail system 520, or may be installed only on one side side of the rail system 520.

Referring to FIG. 4, the electrical power receiver 430 may be disposed on a back face of the controller 440 and may be disposed below the driver 410. A single electrical power receiver 430 may be installed below the driver 410 in one example. However, an embodiment is not limited thereto. A plurality of electrical power receivers 430 may be installed on the back face of the controller 440 to improve reception efficiency of a power signal. When the plurality of electrical power receivers 430 are installed on the back face of the controller 440, some electrical power receivers 430 may be installed above the driver 410, while the other electrical power receivers 430 may be installed below the driver 410.

The controller 440 may perform various control functions necessary for an operation of the carriage unit 320. For example, the controller 440 may serve to control the electrical power receiver 430 so that the electrical power receiver 430 may supply the power to the driver 410 so that the driver 410 may operate. The controller 440 may be configured to control the driver 410 such that the carriage unit 320 may move along the mast frame 310. For this purpose, the controller 440 may include various components (e.g., a driver) necessary for the operation of the carriage unit 320, including a conventional processor unit, or may be configured to include an electric box.

Referring to FIG. 1, the loading and unloading apparatus 130 is mechanically configured to connect the stage module 110 and the carriage unit 320 to each other. This loading and unloading apparatus 130 is connected to the carriage unit 320 and the stage module 110, and performs loading and unloading of the article 200 to or from a separate storage space thereof or an external transfer equipment. The loading and unloading apparatus 130 may be disposed in each layer in which loading and unloading of the article 200 is required. Each loading and unloading apparatus 130 may transfer the article using its own driver.

The loading and unloading apparatus 130 may be installed at an end of the stage module 110. The loading and unloading apparatus 130 may move the article 200 seated on the carriage unit 320 onto a rail of the stage module 110 when the carriage unit 320 approaches the end of the stage module 110.

The loading and unloading apparatus 130 may transfer the article 200 from the carriage unit 320 to the stage module 110 using a fork module. However, an embodiment is not limited thereto. The loading and unloading apparatus 130 may move the article 200 from the carriage unit 320 to the stage module 110 using a gripper module.

Next, a method for operating the loading and unloading apparatus 130 will be described.

Figure 7:
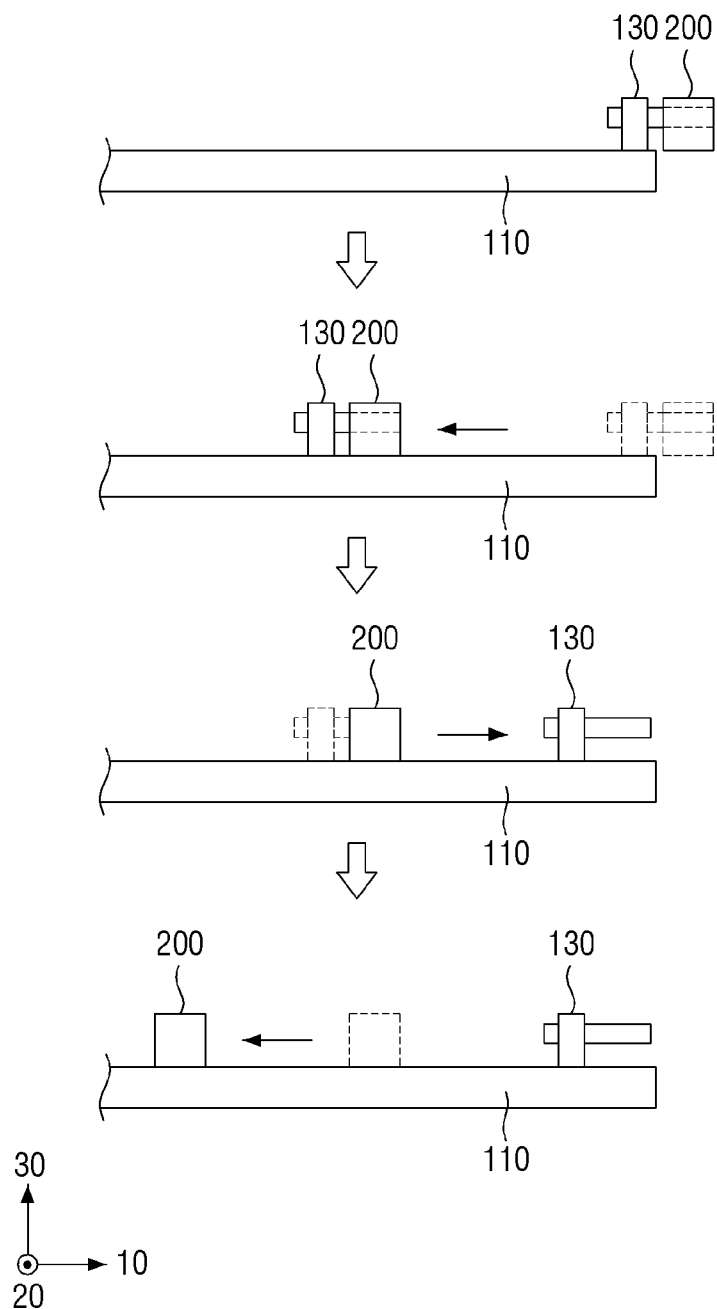
FIG. 7 is a diagram illustrating a method for operating the loading and unloading apparatus of the article transfer system according to an embodiment.

FIG. 7 is a diagram illustrating a method for operating the loading and unloading apparatus of the article transfer system according to an embodiment.

As described above, the loading and unloading apparatus 130 may receive the article 200 from the carriage unit 320 when the carriage unit 320 moves along the mast frame 310 and approaches the stage module 110. In this connection, the loading and unloading apparatus 130 may receive the article 200 loaded on the carriage unit 320 using a gripper module or a fork module.

When the loading and unloading apparatus 130 receives and holds the article 200 from the carriage unit 320, the loading and unloading apparatus 130 may move along the length direction (first direction) 10 of the stage module 110 and load the article 200 onto the rail installed on the stage module 110. The article 200 may then move along the rail to its destination, such as a storage space or another transfer facility (OHT).

In this embodiment, the loading and unloading apparatus 130 may move along the longitudinal direction of the stage module 110 and load the article 200 onto the rail.

Figure 8:
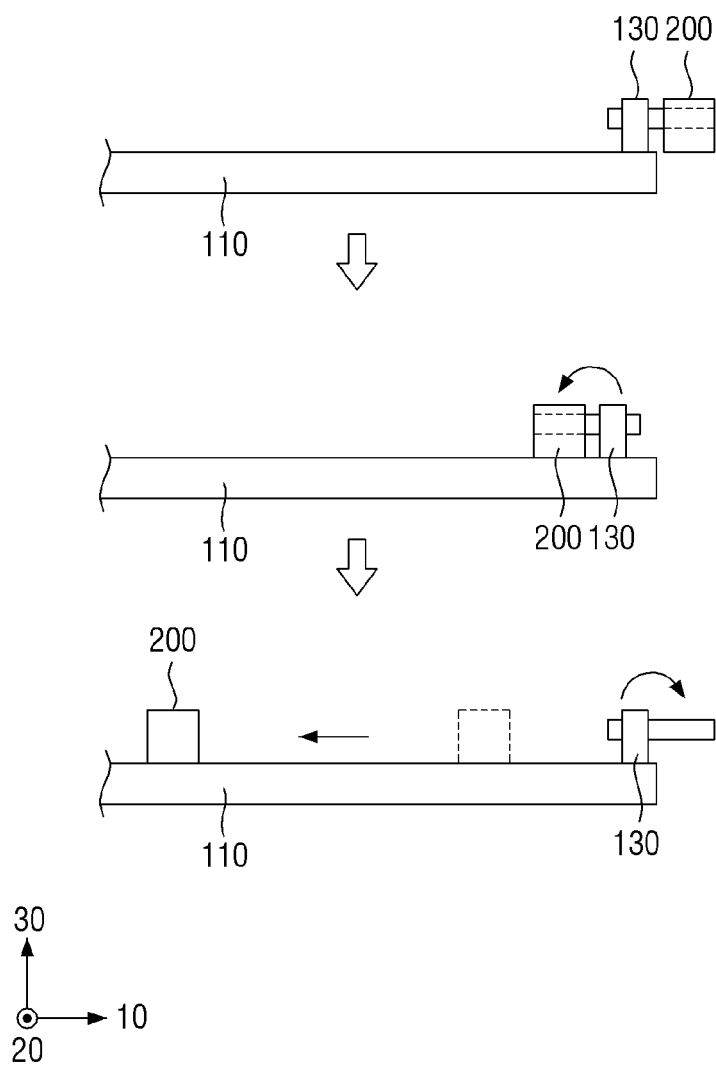
FIG. 8 is a diagram illustrating a method for operating the loading and unloading apparatus of the article transfer system according to an embodiment.

FIG. 8 is a diagram illustrating a method for operating the loading and unloading apparatus of the article transfer system according to an embodiment. Alternatively, the loading and unloading apparatus 130 on the stage module 110 may rotate in a clockwise or counterclockwise direction as shown in FIG. 8 to load the article 200 onto the rail.

In one example, while the loading and unloading apparatus 130 receives and holds the article 200 using a fork module or a holding module, the loading and unloading apparatus 130 may directly move to the destination.

Next, a method of transferring the article 200 using a plurality of carriage units 320 will be described. Although previously described, in this embodiment, the plurality of carriage units 320 may independently operate while being disposed on the mast frame 310 and may move in parallel with each other.

For the interlayer transfer of a designated article 200, the carriage unit 320 moves to an underlying loaded and unloaded position, and then performs loading and unloading of the article via interaction with the loading and unloading apparatus 130. In the loading and unloading operation, the loading and unloading apparatus 130 may load the article 200 to the carriage unit 320. In this connection, the carriage unit 320 may reach a designated loaded and unloaded position and may stop at the position. When the loading and unloading of the article is completed, the carriage unit 320 moves using the driver inside the carriage unit 320. When the carriage unit reaches the designated destination, the movement is terminated. Thereafter, the carriage unit interacts with the loading and unloading apparatus 130. In this way, one carriage unit 320 completes a transfer task.

As described in the above, while one carriage unit is moving after completing the loading and unloading of the article, another carriage unit performs an independent task. As in the above operation example, another carriage unit may interact with the loading and unloading apparatus 130 or may perform separate movement. The above operation of one carriage unit may be performed separately from that of another carriage unit. Thus, parallel loading and unloading of the articles may be achieved in the semiconductor manufacturing factory.

Figure 9:
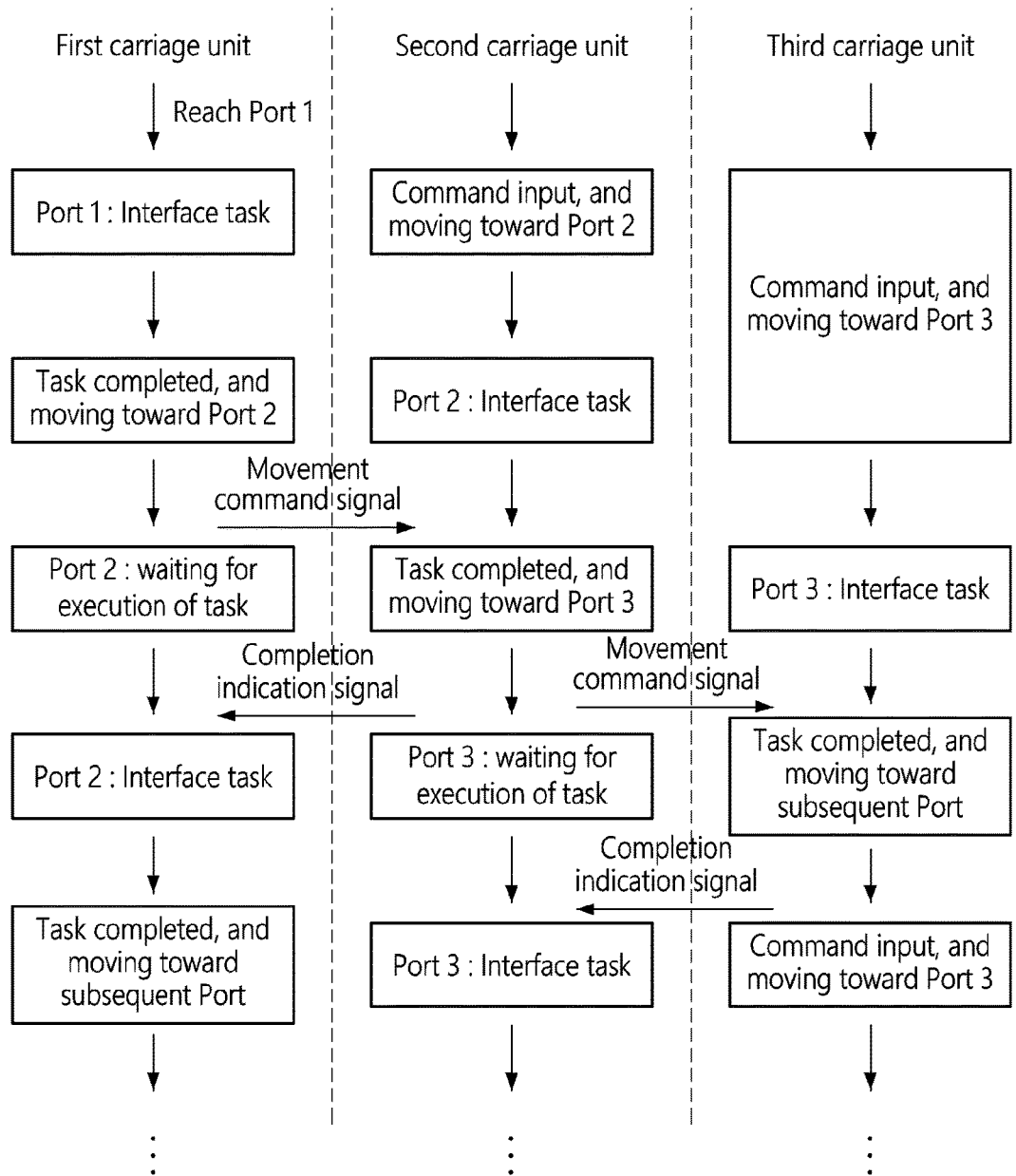
FIG. 9 is a flowchart sequentially illustrating a method for operating the article transfer system according to an embodiment.

FIG. 9 is a flowchart sequentially illustrating a method for operating the article transfer system according to an embodiment. When the plurality of carriage units 320 operate independently and move in parallel with each other, parallel loading and unloading of the articles may be executed in the semiconductor manufacturing factory, for example, according to a process shown in FIG. 9. In this connection, a port 1, a port 2, and a port 3 refer to upper, middle, and lower layers in the semiconductor manufacturing factory, respectively. An interface task means the loading and unloading of the article.

In one example, the operation may be controlled via communication with a higher system, and safety interlock inside the carriage unit 320 may be additionally applied thereto.

An operation example as described below with reference to FIG. 10 to FIG. 14 is based on two carriage units 320a and 320b and two loading and unloading modules 130a and 130b. However, the disclosure is not limited thereto. A plurality of interlayer transfer apparatuses may be flexibly applied to a multi-layer structure based on a structure of the semiconductor manufacturing factory.

Figure 10:
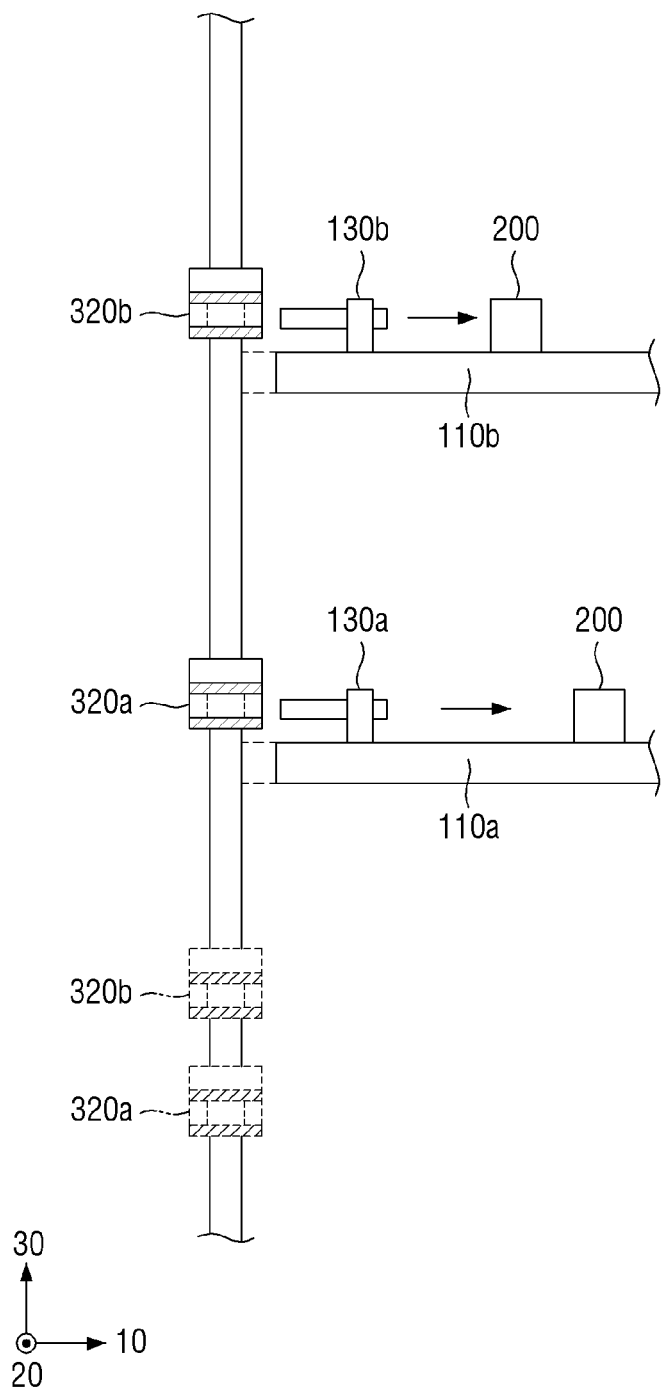
FIG. 10 is a diagram illustrating a method for operating a plurality of carriage units of the article transfer system according to an embodiment.

FIG. 10 is a diagram illustrating a method for operating a plurality of carriage units of the article transfer system according to an embodiment.

In a following description, a carriage unit 320 disposed on the mast frame 310 is defined as a first carriage unit 320a, and a carriage unit 320 disposed on the mast frame 310 and above the first carriage unit 320a is defined as a second carriage unit 320b. Further, a loading and unloading apparatus 130 disposed on a first stage 110a is defined as a first loading and unloading module 130a, and a loading and unloading apparatus 130 disposed on a second stage 110b higher than the first stage 110a is defined as a second loading and unloading module 130b.

When the first carriage unit 320a carries an article 200 onto the first stage 110a, and the second carriage unit 320b carries an article 200 on the second stage 110b, the first carriage unit 320a and the second carriage unit 320b may move simultaneously and access the first stage 110a and the second stage 110b, respectively.

However, an embodiment is not limited thereto. The upper second carriage unit 320b may first move toward the upper second stage 110b, and then, after a certain time duration has elapsed, the lower first carriage unit 320a may move toward the lower first stage 110a.

When the first carriage unit 320a approaches the first stage 110a, the first loading and unloading module 130a may unload the article 200 from the first carriage unit 320a and load the article 200 onto the rail on the first stage 110a. Then, the article 200 may move to a destination along the length direction of the first stage 110a.

Similarly, when the second carriage unit 320b approaches the second stage 110b, the second loading and unloading module 130b may unload the article 200 from the second carriage unit 320b and then may load the article 200 onto the rail on the second stage 110b. Then, the article 200 may move to a destination along the length direction of the second stage 110b.

When each of the first carriage unit 320a and the second carriage unit 320b reaches each designated position, each of the first loading and unloading module 130a and the second loading and unloading module 130b may operate immediately. In this case, the first loading and unloading module 130a and the second loading and unloading module 130b may operate at different timings.

For example, a travel distance of the second carriage unit 320b may be larger than a travel distance of the first carriage unit 320a so that the first carriage unit 320a may first reach the first stage 110a and when the second carriage unit 320b may reach the second stage 110b. In this case, the first loading and unloading module 130a may first unload and load the article 200, and then, the second loading and unloading module 130b may unload and load the article 200.

However, an embodiment is not limited thereto. At least one loading and unloading module of the first loading and unloading module 130a and the second loading and unloading module 130b may operate when a predefined time duration has elapsed after each of the first carriage unit 320a and the second carriage unit 320b has reached each designated position. In this case, the first loading and unloading module 130a and the second loading and unloading module 130b may operate simultaneously.

Figure 11:
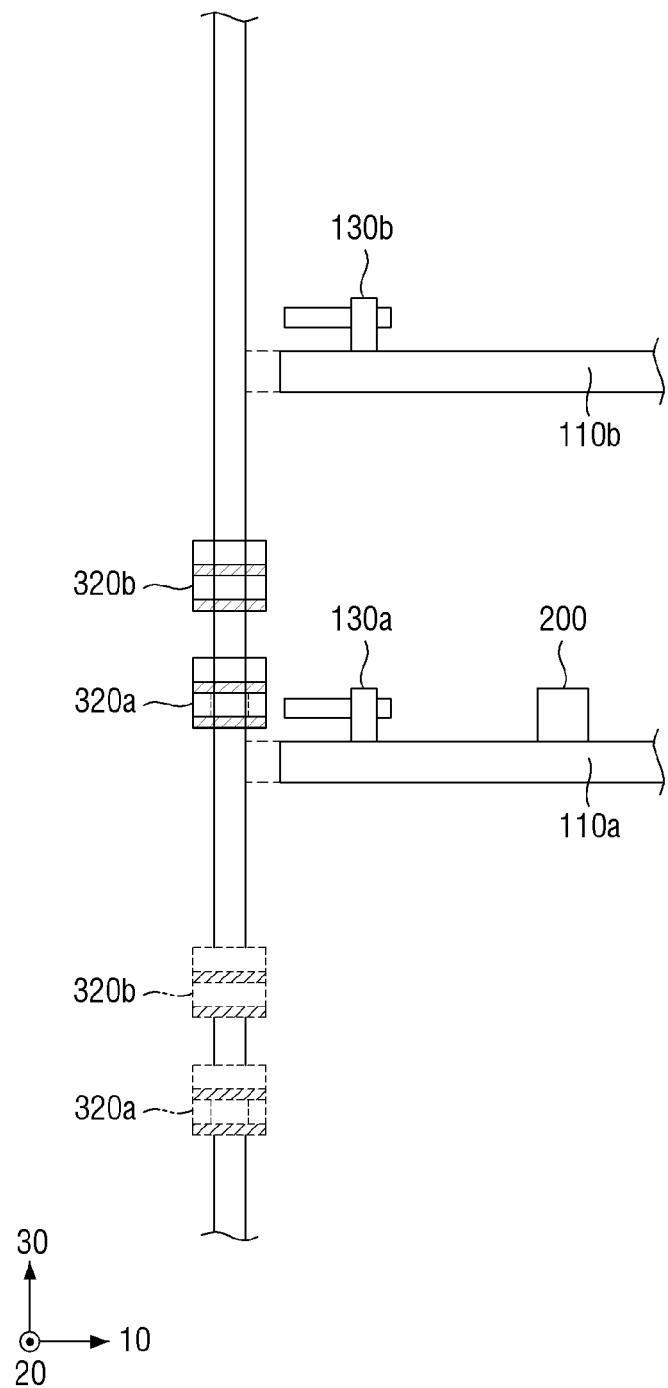
FIG. 11 is a diagram illustrating a method for operating a plurality of carriage units of the article transfer system according to an embodiment.

FIG. 11 is a diagram illustrating a method for operating a plurality of carriage units of the article transfer system according to an embodiment. In one example, only the lower first carriage unit 320a may have the article 200 loaded thereon. Hereinafter, this will be described.

When the upper second carriage unit 320b has no article 200 to carry thereon and only the lower first carriage unit 320a has the article 200 to carry thereon, the upper second carriage unit 320b may move together with the lower first carriage unit 320a. When the lower first carriage unit 320a loads the article 200 on the first stage 110a, the upper second carriage unit 320b may move to a higher position than the first stage 110a. When the lower first carriage unit 320a loads the article 200 on the second stage 110b, the upper second carriage unit 320b may move to a higher position than the second stage 110b.

When the lower first carriage unit 320a load the article 200 onto the first stage 110a, the first carriage unit 320a may access the first stage 110a, and the first loading and unloading module 130a may unload the article 200 from the first carriage unit 320a and may load the article 200 onto the rail on the first stage 110a.

Figure 12:
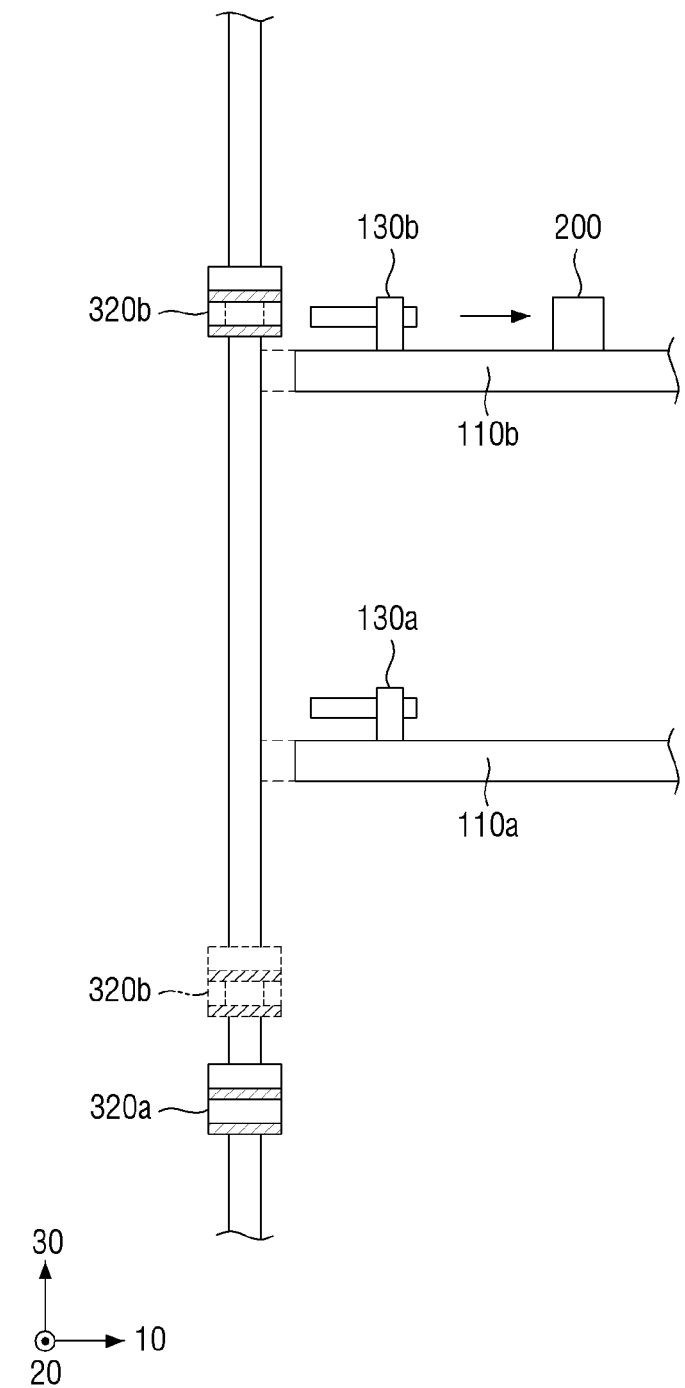
FIG. 12 is a diagram illustrating a method for operating a plurality of carriage units of the article transfer system according to an embodiment.

FIG. 12 is a diagram illustrating a method for operating a plurality of carriage units of the article transfer system according to an embodiment. In one example, as shown in FIG. 12, when only the upper second carriage unit 320b has an article 200 to carry thereon, the lower first carriage unit 320a does not move and only the upper second carriage unit 320b moves and transfers the article 200.

Figure 13:
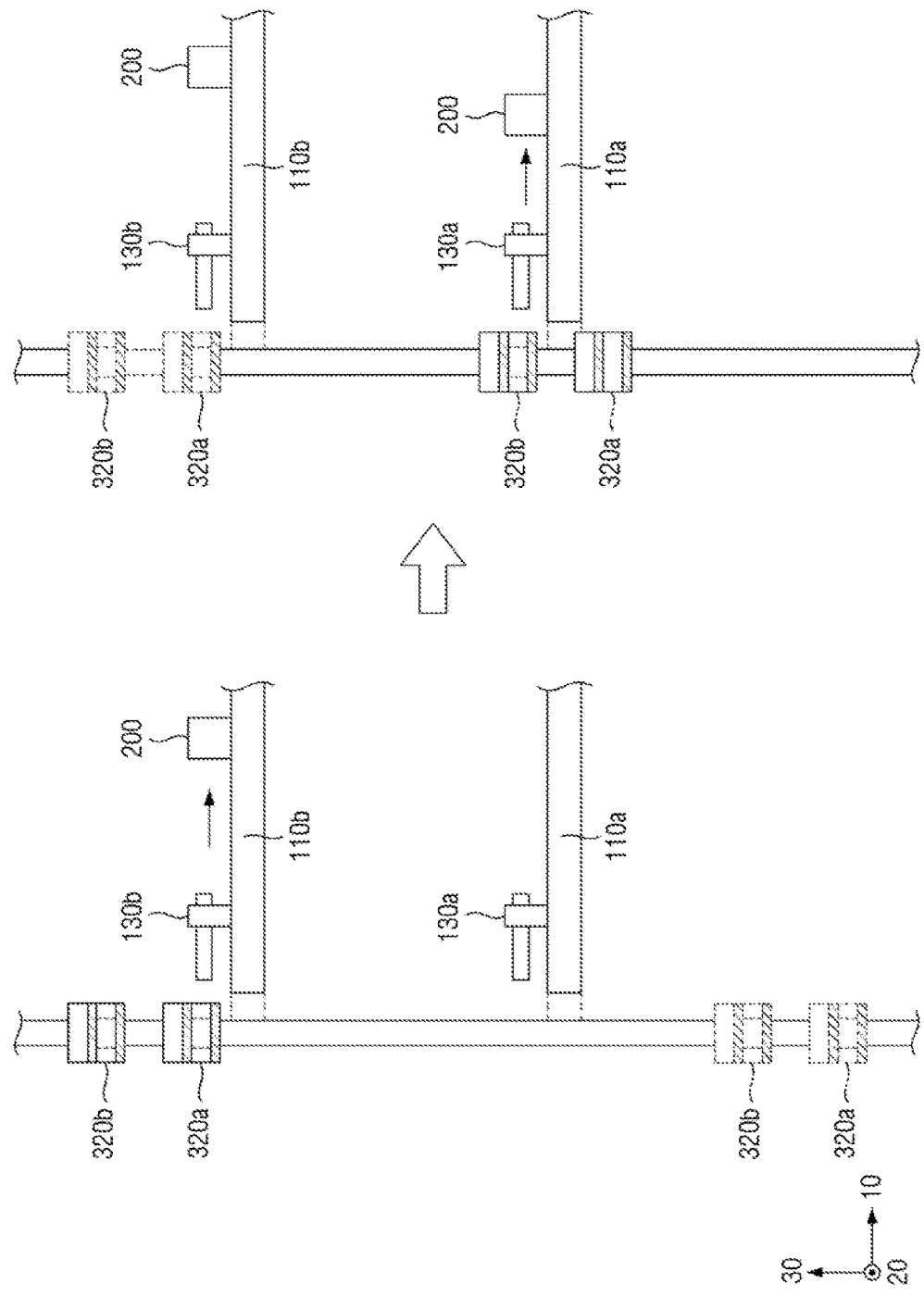
FIG. 13 is a diagram illustrating a method for operating a plurality of carriage units of the article transfer system according to an embodiment.

FIG. 13 is a diagram illustrating a method for operating a plurality of carriage units of the article transfer system according to an embodiment. In one example, there may be a case where each of the lower first carriage unit 320a and the upper second carriage unit 320b has an article to carry thereon, but the lower first carriage unit 320a needs to transport the article 200 to a higher position than a position to which the upper second carriage unit 320b transport the article 200.

When lower first carriage unit 320a carries the article 200 to the upper second stage 110b and the upper second carriage unit 320b carries the article 200 to the lower first stage 110a, the first carriage unit 320a and the second carriage unit 320b may move simultaneously such that the first carriage unit 320a reaches the second stage 110b rather than the first stage 110a.

When the first carriage unit 320a has reached the second stage 110b, the second loading and unloading module 130b may unload the article 200 from the first carriage unit 320a and load the article onto the rail on the second stage 110. Then, the first carriage unit 320a and the second carriage unit 320b may move simultaneously again so that the second carriage unit 320b may reach the first stage 110a rather than the second stage. In this case, the first carriage unit 320a and the second carriage unit 320b may move in the opposite direction to a previous moving direction.

When the second carriage unit 320b has reached the first stage 110a, the first loading and unloading module 130a may unload the article 200 from the second carriage unit 320b and may load the article onto the rail on the first stage 110a.

Figure 14:
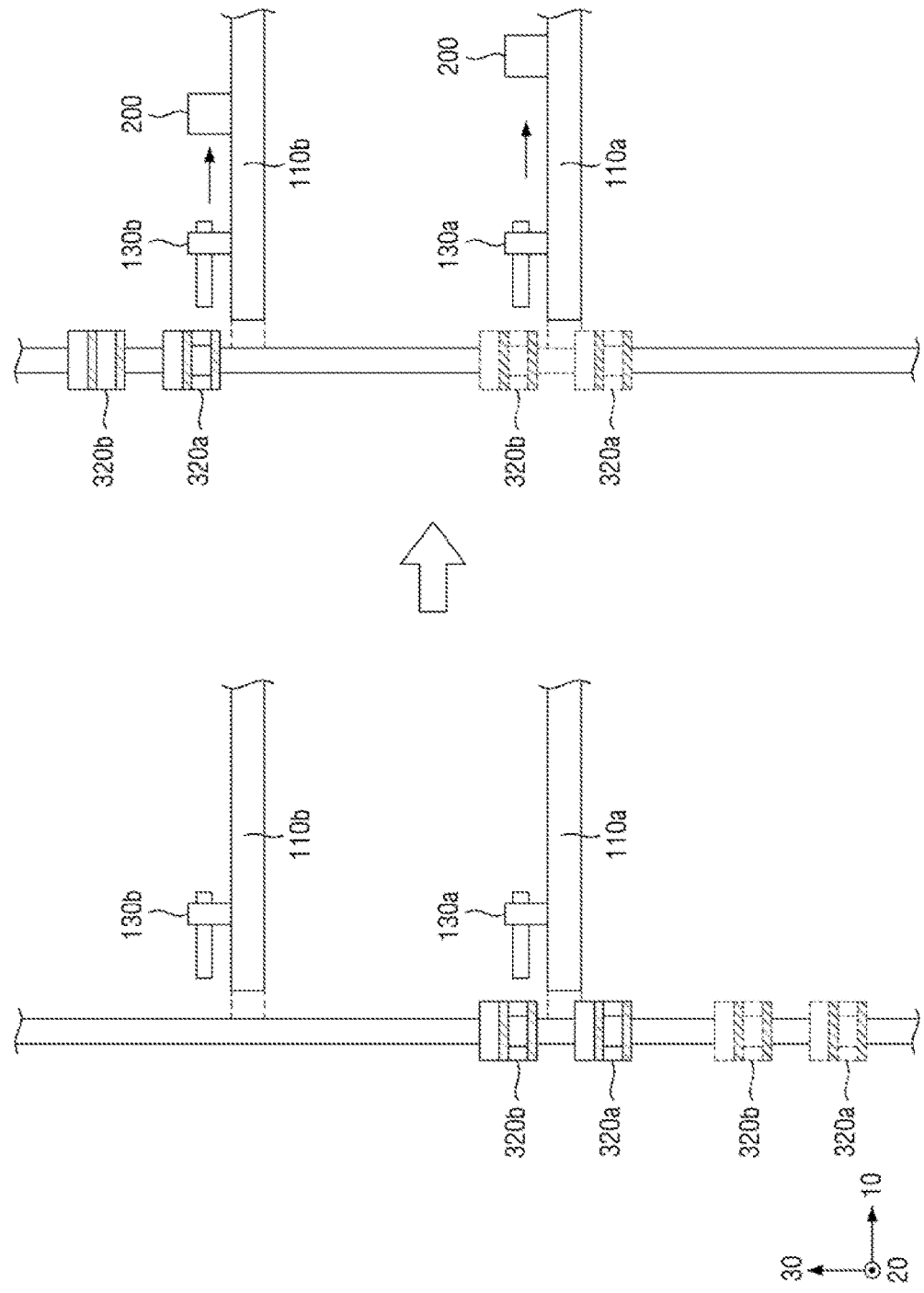
FIG. 14 is a diagram illustrating a method for operating a plurality of carriage units of the article transfer system according to an embodiment.

FIG. 14 is a diagram illustrating a method for operating a plurality of carriage units of the article transfer system according to an embodiment. In another example, as shown in FIG. 14, the first carriage unit 320a and the second carriage unit 320b may move simultaneously so that the second carriage unit 320b may reach the first stage 110a rather than the second stage. Then, the first carriage unit 320a and the second carriage unit 320b may further move so that the first carriage unit 320a may reach the second stage 110b rather than the first stage.

With reference to FIG. 1 to FIG. 14, the interlayer transfer apparatus 120 and the article transfer system 100 including the same have been described above. The article transfer system 100 according to the present disclosure acts as a parallel interlayer transfer facility for improving the interlayer article transfer in a semiconductor manufacturing factory with a multi-layer structure. In accordance with the present disclosure, the plurality of carriage units 320 may be disposed on a single mast frame 310 to improve a transfer amount of the interlayer article transfer apparatus and to minimize the bottleneck occurring in each layer during the transfer. Further, the facility as described in the present disclosure has an advantage in terms of flexibility and thus may respond appropriately to rapidly changing transfer requirements. In accordance with the present disclosure, the interlayer transfer efficiency may be maximized to improve the article transfer in an entire area of the semiconductor manufacturing factory.

The article transfer system 100 may include the plurality of carriage units 320 that perform interlayer transfer of the articles 200 within the facility, the mast frame 310 that supports the carriage units and guides movement thereof, and the loading and unloading apparatus 130 that serves as a contact point between the carriage unit 320 and an external facility. As described above, in the multi-layer factory structure, the plurality of carriage units 320 may move in parallel with each other in one transfer facility and the loading and unloading of the articles may be performed using the loading and unloading apparatus 130 at each layer. While one carriage unit moves and performs the loading and unloading of the article via the interaction with the loading and unloading apparatus 130, another carriage unit in the same facility may operate independently of one carriage unit. The operation may be controlled via a higher system, and the safety interlock within the article transfer system 100 may be applied thereto.

Effects that may be obtained via the interlayer transfer apparatus 120 and the article transfer system 100 including the same, as described above with reference to FIG. 1 to FIG. 14 are summarized as follows.

First, the interlayer transfer apparatus 120 and the article transfer system 100 including the same may improve ability and efficiency of the facility. That is, the interlayer transfer apparatus 120 and the article transfer system 100 including the same may improve the transfer capability using the plurality of carriage units 320 in the same facility.

Second, each carriage unit has each driver therein to achieve independent driving of each of the carriage units. Thus, tasks may be executed in a parallel manner.

Third, the article transfer amount may be controlled after the facility installation. That is, the article transfer amount may be adjusted by controlling the number of the carriage units 320 on the mast frame 310.

What is claimed is:

1. An article transfer system, comprising:
   a plurality of stage modules respectively provided at a plurality of layers;
   an interlayer transfer apparatus configured to transfer an article to each of the plurality of stage modules; and
   a plurality of loading and unloading apparatus respectively provided on each stage module of the plurality of stage modules, the plurality of loading and unloading apparatus configured to load an article onto respective stage modules of the plurality of stage modules,
   wherein the interlayer transfer apparatus comprises:
   a mast frame extending so as to intersect each stage module of the plurality of stage modules; and
   a plurality of carriage units configured to:
   move along a length direction of the mast frame,
   transfer articles, and
   move in a parallel manner with each other.

2. The system of claim 1, wherein the plurality of carriage units are configured to operate independently.

3. The system of claim 2, wherein each of the plurality of carriage units comprises a respective built-in driver.

4. The system of claim 1, wherein the interlayer transfer apparatus further comprises:

a balance controller provided on the mast frame; and
a rail provided on the mast frame and configured to guide movement of the plurality of carriage units,
wherein the balance controller is provided on a first side face of the mast frame, and the rail is provided on a second side face of the mast frame different from the first side face.

5. The system of claim 4, wherein the balance controller comprises a plurality of balance controllers, and
wherein the plurality of balance controllers are configured to be respectively connected to the plurality of carriage units.

6. The system of claim 4, wherein the balance controller comprises a plurality of balance controllers, and
wherein the plurality of balance controllers are arranged in a plurality of rows and extend along the length direction of the mast frame.

7. The system of claim 1, wherein each carriage unit of the plurality of carriage units comprises:
a driver configured to supply power to a respective carriage unit to move along the mast frame;
an article receiving portion comprising a seating face configured to load an article thereon;
an electrical power receiver configured to receive electrical power and supply the electrical power to the driver; and
a controller configured to control an operation of the driver and the electrical power receiver.

8. The system of claim 7, wherein the driver comprises a linear motor or a pinion gear.

9. The system of claim 1, wherein the mast frame comprises an electrical power supply, and each carriage unit of the plurality of carriage units comprises an electrical power receiver configured to receive electrical power from the electrical power supply, and
wherein the electrical power supply and the electrical power receiver communicate the electrical power in a contactless manner.

10. The system of claim 1, wherein each of the plurality of stage modules comprises a rail disposed on a top face thereof, and
wherein the plurality of loading and unloading apparatus are configured to load articles onto the rail.

11. The system of claim 10, wherein the plurality of loading and unloading apparatus are configured to move linearly along a length direction of the stage module.

12. The system of claim 1, wherein the plurality of carriage units are configured to move simultaneously along the length direction of the mast frame.

13. The system of claim 12, wherein the plurality of carriage units are configured to move simultaneously when at least one carriage unit of the plurality of carriage units carries an article.

14. The system of claim 12, wherein when the plurality of carriage units are configured to move a plurality of times, wherein a first movement direction corresponding to first time of the plurality of times is opposite to a second movement direction corresponding to second time of the plurality of times subsequent to the first time.

15. The system of claim 1, wherein the mast frame comprises a buffer space in which the plurality of carriage units is movable, and
wherein the buffer space is positioned above a topmost stage module of the plurality of stage modules.

16. The system of claim 15, wherein the plurality of carriage units comprises:
a first carriage unit provided on the mast frame; and
a second carriage unit provided above the first carriage unit and on the mast frame,
wherein the second carriage unit is configured to move to the buffer space based on the first carriage unit transferring an article to the topmost stage module.

17. The system of claim 1, wherein the article transfer system is provided in a semiconductor device manufacturing factory.

18. An article transfer system comprising:
a plurality of stage modules respectively provided at a plurality of layers;
an interlayer transfer apparatus configured to transfer an article to each of the plurality of stage modules; and
a plurality of loading and unloading apparatus respectively provided on each stage module of the plurality of stage modules, and the plurality of loading and unloading apparatus configured to load an article onto respective stage modules of the plurality of stage modules,
wherein the interlayer transfer apparatus comprises:
a mast frame extending so as to intersect each stage module of the plurality of stage modules;
a plurality of carriage units configured to move along a length direction of the mast frame and to transfer the article;
a balance controller provided on the mast frame; and
a rail provided on the mast frame and configured to guide movement of the plurality of carriage units,
wherein the plurality of carriage units are configured to move in a parallel manner with each other and operate independently,
wherein each carriage unit of the plurality of carriage units comprises a built-in driver, and
wherein the balance controller is provided on a first side face of the mast frame, and the rail is provided on a second side face of the mast frame different from the first side face,
wherein the balance controller comprises a plurality of balance controllers, and the plurality of balance controllers are configured to be respectively connected to the plurality of carriage units.

19. An interlayer transfer apparatus for transferring articles to each of a plurality of stage modules respectively provided at a plurality of layers, the apparatus comprising:
a mast frame extending so as to intersect each stage module of the plurality of stage modules; and
a plurality of carriage units configured to:
move along a length direction of the mast frame,
transfer articles,
move in a parallel manner with each other, and
operate independently.

20. The apparatus of claim 19, further comprising:
a balance controller provided on the mast frame; and
a rail provided on the mast frame and configured to guide movement of the plurality of carriage units,
wherein the balance controller is installed on a first side face of the mast frame, and the rail is installed on a second side face of the mast frame different from the first side face.

* * * * *